United States Patent
Hsieh et al.

(10) Patent No.: US 7,789,671 B2
(45) Date of Patent: Sep. 7, 2010

(54) ELECTRICAL CONTACT WITH OVERLAPPING STRUCTURE

(75) Inventors: Wen-Yi Hsieh, Tu-Cheng (TW); Shih-Wei Hsiao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/485,066

(22) Filed: Jun. 16, 2009

(65) Prior Publication Data

US 2009/0311886 A1 Dec. 17, 2009

(30) Foreign Application Priority Data

Jun. 16, 2008 (TW) .............................. 97210594 U

(51) Int. Cl.
*H01R 12/00* (2006.01)
(52) U.S. Cl. ......................................... 439/66; 439/884
(58) Field of Classification Search .................... 439/66, 439/700, 884
See application file for complete search history.

(56) References Cited

U.S. PATENT DOCUMENTS

| | | | |
|---|---|---|---|
| 4,385,754 A * | 5/1983 | Waite | 267/71 |
| 6,159,056 A * | 12/2000 | Boyle | 439/700 |
| 6,861,862 B1 * | 3/2005 | Tate | 324/761 |
| 7,025,602 B1 * | 4/2006 | Hwang | 439/66 |
| 7,256,593 B2 * | 8/2007 | Treibergs | 324/754 |
| 7,285,026 B1 * | 10/2007 | Ju | 439/700 |
| 7,467,952 B2 * | 12/2008 | Hsiao et al. | 439/66 |
| 7,485,011 B2 * | 2/2009 | Hsu | 439/700 |
| 7,520,754 B1 * | 4/2009 | Gattuso | 439/66 |
| 7,545,159 B2 * | 6/2009 | Winter | 324/761 |
| 7,559,769 B2 * | 7/2009 | Hsiao et al. | 439/66 |
| 7,559,806 B2 * | 7/2009 | Lin et al. | 439/700 |
| 2006/0279301 A1 * | 12/2006 | Treibergs | 324/754 |

\* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

An electrical contact includes a first contact pin, a second contact pin and an elastic member surrounding the first contact pin and the second contact pin. Both of the first contact pin and the second contact pin include contacting portions. The first contact pin has a guiding portion including two lead-in arms and a stop portion between the two leading arms. The second contact has a main body and a protrusion on a top end of the main body. The leading arms define a guiding groove therebetween for the main body of the second contact pin moving up and down. The protrusion abuts against the stop portion of the first contact pin to prevent the second contact from sliding out of the guiding groove.

14 Claims, 4 Drawing Sheets

ELECTRICAL CONTACT WITH OVERLAPPING STRUCTURE

BACKGROUND OF THE INVENTION

1. Field of the Invention

The present invention relates generally to an electrical contact for electronic devices, and more particularly to an electrical contact with overlapping structure for electrically connecting a lead of an integrated circuit (IC) to a corresponding pad of a printed circuit board (PCB).

2. Description of the Related Art

U.S. Pat. No. 7,025,602 issued to Hwang on Apr. 11, 2006, discloses a conventional contact which comprises an upper and a lower contact pins and a spring. The upper and the lower contact pins and the spring are all arranged uprightly in a line and received in. The spring is arranged between the upper and the lower contact pins and provides a repellent force for those two contact pins to move away from each other. A top end of the upper contact pin and a bottom end of the lower contact pin project out of two opening defined on two opposite ends of the pipe body respectively. The openings are dimensioned for preventing those two contact pins from falling off the pipe body during operation.

The electrical contact described above has following disadvantages. Firstly, the upper and the lower contact pins are of cylindrical shape, and are not easy to manufacture. Secondly, the lower contact pin, the spring and the upper contact pin should be assembled in the pipe body orderly, so that it is difficult to assemble the components for such a complicated assembling process, thus productivity of the electrical contact is low. Thirdly, the openings are easy to be abraded by the high-frequently-encountered friction between the two contact pins and the pipe body. Furthermore, manufacturing cost of the electrical contact is high due to a large amount of machining work.

Hence, it is desirable to provide an improved electrical contact to overcome the aforementioned disadvantages.

SUMMARY OF THE INVENTION

An object of the present invention is to provide an electrical contact with an overlapping structure for connecting electronic devices, which is easily produced and assembled.

In order to achieve the above-mentioned object, an electrical contact includes a first contact pin, a second contact pin and an elastic member surrounding the first contact pin and the second contact pin. Both of the first contact pin and the second contact pin include contacting portions with a first projecting portion and a second projecting portion extending from corresponding contacting portions, respectively. The first contact pin has a guiding portion including two leading arms and a stop portion connecting with the two leading arms. A guiding groove is defined between the two leading arms and including a first guiding slot located above the stopping portion and a second guiding slot located at a front side of the stopping portion. The second contact pin has a main body extending from the second projecting portion and a protrusion disposed on an end of the main body. The protrusion is received in the first guiding slot and abuts against the stopping portion of the first contact pin, the main body received in the second guiding slot.

Other features and advantages of the present invention will become more apparent to those skilled in the art upon examination of the following drawings and detailed description of preferred embodiments.

DETAILED DESCRIPTION OF PREFERRED EMBODIMENT

Figure 1:
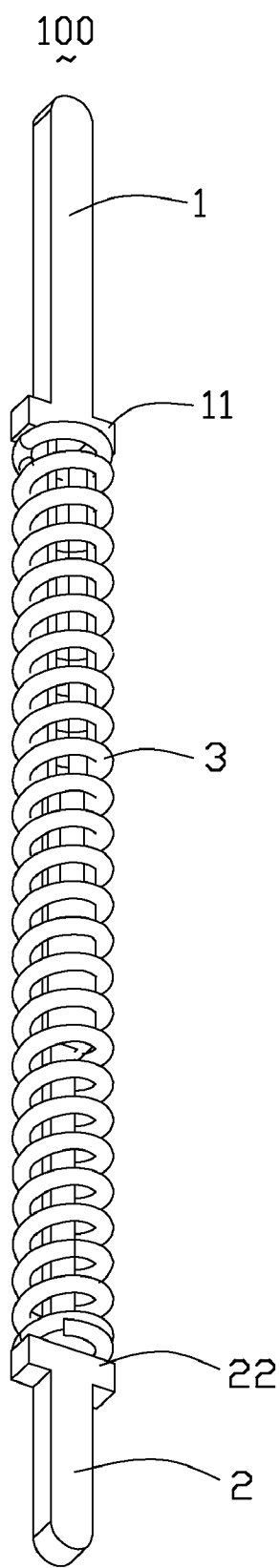
FIG. 1 is an assembled perspective view of an electrical contact in accordance with the present invention.

Reference will now be made to the drawing figures to describe the preferred embodiments of the present invention in detail.

Referring to FIGS. 1 to 4, an electrical contact 100 in accordance with the present invention is adapted for being arranged in a test socket or a burn-in socket for receiving an IC and electrically connecting the IC to a PCB. In such a state, the test socket performs a test to the IC. The electrical contact 100 comprises a first contact pin 1, a second contact pin 2 and an elastic member 3 fitted over a predetermined area between the first contact pin 1 and the second contact pin 2.

Figure 2:
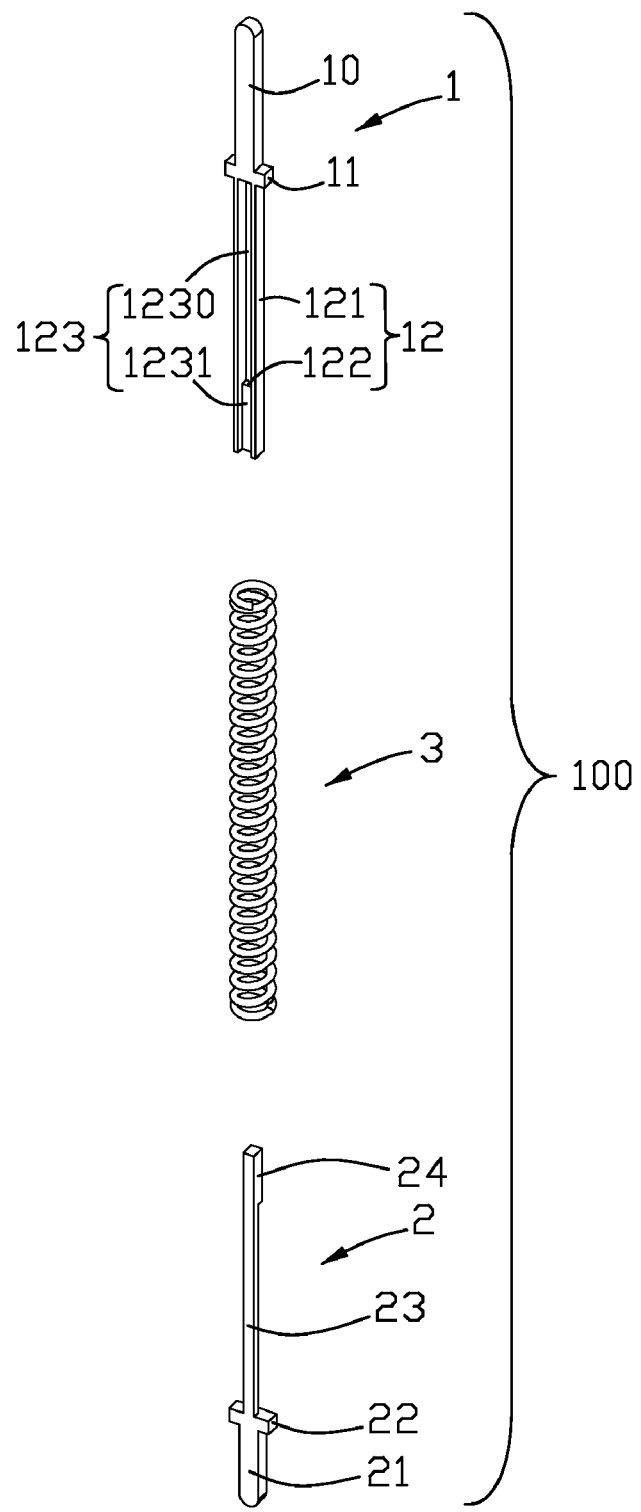
FIG. 2 is an exploded perspective view of the electrical contact of FIG. 1.
Figure 3:
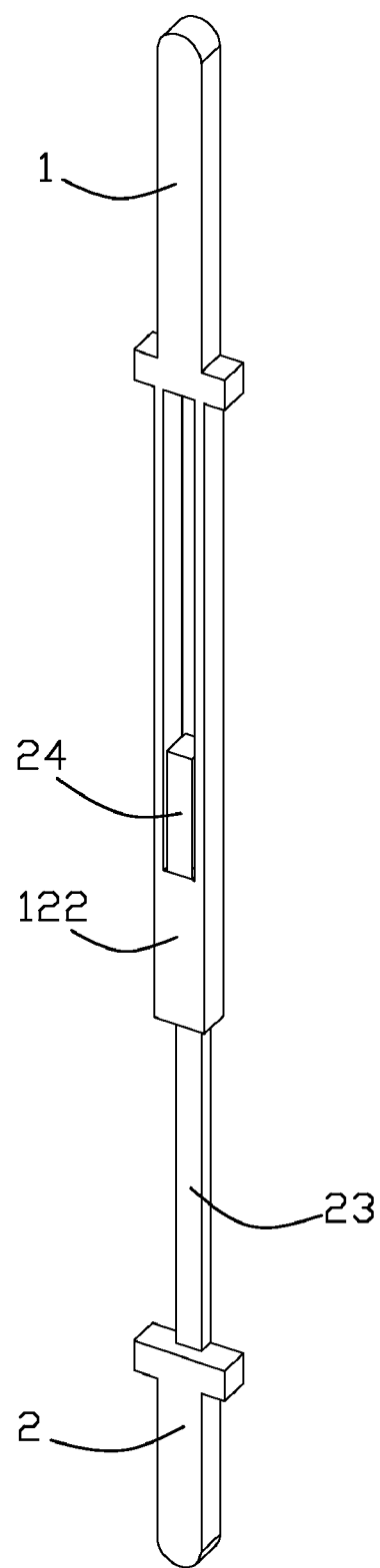
FIG. 3 is an assembled perspective view of a first contact pin and a second contact pin of the electrical contact of FIG. 1 which connect with each other and is positioned at an initial status.
Figure 4:
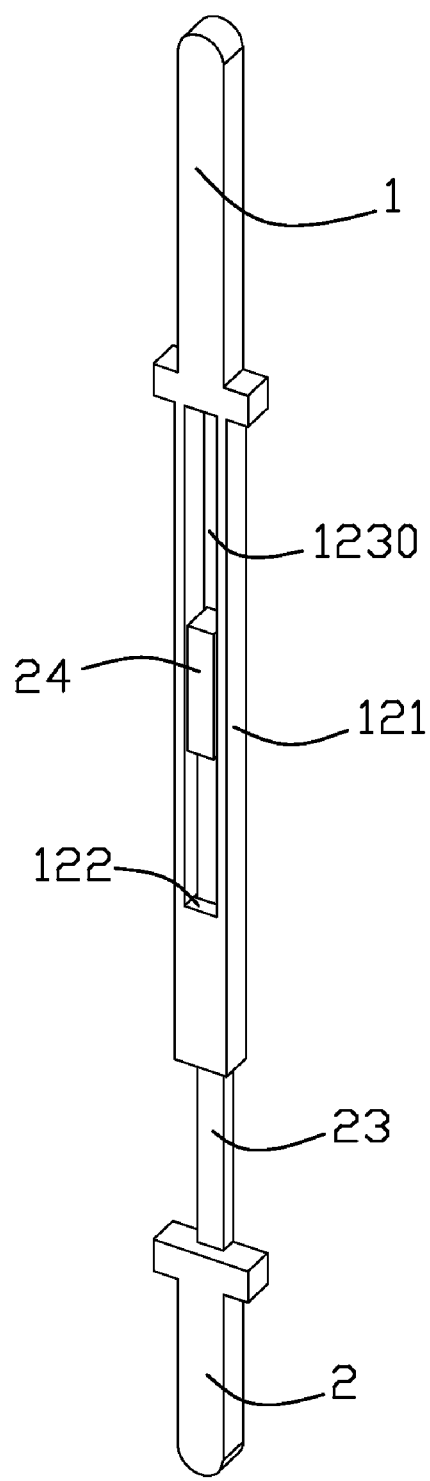
FIG. 4 is an assembled perspective view of the first contact pin and the second contact pin of the electrical contact of FIG. 1 connecting with each other and positioned at a compressed status.

As shown in FIG. 2, the first contact pin 1 stamped from a sheet metal includes a slender contacting portion 10 with a sharp top end for contacting with the IC. A pair of first projecting portions 11 are provided on lateral sides of a bottom end of the contacting portion 10 for limiting the elastic member 3. The first projecting portions 11 are vertical to the contacting portion 10 which extends uprightly. The elastic member 3 is positioned under the first projecting portions 11, and will not move over the first projecting portions 11 since a transverse length of the two first projecting portions 11 is wider than a diameter of the elastic member 3. A guiding portion 12 extends downwardly and vertically to the first projecting portions 11 for leading a vertical motion of the second contact pin 2.

The guiding portion 12 includes a pair of leading arms 121 parallel to each other and a stopping portion 122 connecting with two bottom ends of the pair of leading arms 121. A slender guiding groove 123 is defined between the two spaced leading arms 121. The guiding groove 123 defines a first guiding slot 1230 located above the stopping portion 122 and a second guiding slot 1231 located at a front side of the stopping portion 122. Because the stopping portion 122 is not occupied full space of the two leading arms 121 in a cross-sectional but only located at a back side of a space between the leading arms 121, so that the second guiding slot 1231 is formed on the front side of the stopping portion 122 with the stopping portion 122 as a bottom wall thereof. The first guiding slot 1230 and the second guiding slot 1231 interengaged with each other at a vertical direction so as to make the second contact pin 2 moving freely at the vertical direction.

The second contact pin 2 is also produced from a sheet metal and includes a contacting portion 21 for connecting with the PCB, a second projecting portion 22 formed on a top end of the contacting portion 21 and extending over two sides of the contacting portion 21, and a main body 23 extending upwardly from the second projecting portion 22 and being perpendicular to the second projecting portion 22 and a protrusion 24 formed on a top end of the main body 23. The second projecting portion 22 can limit a bottom end of the elastic member 3. A transversal length of the second projecting portion 22 is wider than the diameter of the elastic member 3 to restrict the downward movement of the elastic member 3, thereby the elastic member 3 is not easy to detach from the second contact pin 2.

A thickness of the leading arms 121, which is also a depth of the first guiding slot 1230 of the first contact pin 1, is same as a thickness of the protrusion 24 of the second contact pin 2, so that the protrusion 24 of the second contact pin 2 can be fully received in the first guiding groove 1230 of the first contact pin 1. And another depth of the second guiding slot 1231 of the first contact pin 1 is same as a thickness of the main body 23 of the second contact pin 2, so that the main body 23 of the second contact pin 2 can be fully received in the second guiding slot 1231 of the first contact pin 2. At an initial status, the protrusion 24 of the second contact pin 2 is received in the first guiding slot 1230 and abuts on the stopping portion 122 of the first contact pin 1, and a top portion of the main body 23 of the second contact pin 2 is received in the second guiding slot 1231 of the first guiding slot 1230, and thus the first contact pin 1 and the second contact pin 2 are assembled together. At this status, the first contact pin 1 and the second contact pin 2 interlock with each other and lie in a same line along the vertical direction. When the second contact pin 2 moves along the guiding groove 123 of the first contact pin 1 at the vertical direction, the two leading arms 121 guide and limit movements of the main body 23 and the protrusion 24 of the second contact pin 2. Thus the second contact pin 2 can move straight at the vertical direction and remain a steady electrical connection with the first contact pin 1.

The elastic member 3 is typically a spring and extends exteriorly around the guiding portion 12 of the first contact pin 1 and the main body 23 of the second contact pin 2. An upper end and a bottom end of the elastic member 3 seat on the first projecting portions 11 of the first contact pin 1 and the second projecting portions 22 of the second contact pin 2 for positioning the elastic member 3 respectively. The elastic member 3 can be compressed and moves up and down.

When assembling, the elastic member 3 is firstly fitted over the guiding portion 12 of the first contact pin 1, then compresses the elastic member 3 and puts the second contact pin 2 into the elastic member 3 and makes the protrusion 24 assembled in the second guiding groove 1231. Then the elastic member 3 is released, which then forces the second contact pin 2 to move downwardly till the protrusion 24 of the second contact pin 2 seat on the stopping portion 122 of the first contact pin 1. So the first contact pin 1 and the second contact pin 2 engage with each other stably. The main body 23 and the protrusion 24 of the second contact pin 2 are received in the guiding groove 123 and move freely at the vertical direction. Additionally, the limitation of the two leading arms 121 to the main body 23 and the protrusion 24 make the second contact pin 2 can not be easily disengaged from each other. When the assembly of the electrical contact 100 is completed, the elastic member 3 is limited between the first projecting portion 11 and the second projecting portion 22 for providing an repulsive force. The contacting portion 10 of the first contact pin 1 can connect with the IC and the contacting portion 21 of the second contact pin 2 can connect with the PCB respectively so as to realize an electrical connection.

The electrical contact 100 of the present invention has some advantages as follow. The main body 23 and the protrusion 24 can be completely received in the guiding groove 123, so that the first contact pin 1 and the second contact pin 2 can cross-sectionally with each other at the thickness direction. Thus it can save a space occupied by the electrical contact 100, especially along cross-sectional direction. Furthermore, the overlapping structure of the electrical contact 100 can provide a limit to the movement along the vertical direction of the electrical contact 100 and realize a steady connection between the first contact pin 1 and the second contact pin 2. Furthermore, the assembly process of the electrical contact 100 is easier than the conventional contact.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical contact comprising:
a first contact pin having an upper contacting portion and a guiding portion having a pair of leading arms extending downwardly from the upper contacting portion, a stop portion disposed between the two leading arms and not occupying a whole space of a cross-section of the guiding portion, a guiding groove defined between the two leading arms and including a first guiding slot located above the stop portion and a second guiding slot located below the first guiding slot and at a front side of the stop portion in a thickness direction of the guiding portion;
a second contact pin having a lower contacting portion, a main body extending upwardly from the lower contacting portion, and a protrusion extending from the main body and moveably disposed within the guiding groove, the protrusion sliding within the first guiding slot up and down and retained on a top end of the stop portion at a lowest position of the first guiding slot, the main body sliding within the second guiding slot at a vertical direction; and
an elastic member enveloped around the main body and the protrusion to provide a repulsive force between the first and second contact pins; wherein
the first contact pin comprises a first projecting portion extending from the upper contacting portion, and the second contact pin comprises a second projecting portion extending from the lower contacting portion, and the main body extends from the second projecting portion; wherein
the stop portion connects with the two leading arms to be used as a bottom wall of the second guiding slot, and the two leading arms are regarded as two opposite sidewalls of the second guiding slot.

2. The electrical contact as described in claim 1, wherein a depth of the first guiding slot of the first contact pin is same as a thickness of the protrusion of the second contact pin, and a depth of the second guiding slot of the first contact pin is same as a thickness of the main body of the second contact pin.

3. The electrical contact as described in claim 1, wherein the guiding portion extends vertically to the first projecting portions for leading a vertical movement of the second contact pin.

4. The electrical contact as described in claim 1, wherein the two leading arms of the first contact pin are parallel to each other.

5. The electrical contact as described in claim 1, wherein the main body extends upwardly and is perpendicular to the second projecting portion of the second contact pin.

6. The electrical contact as described in claim 1, wherein the protrusion is formed on a top end of the main body of the second contact pin.

7. An electrical contact comprising:
a first contact pin having a first contacting portion and a guiding portion extending from an inner end of the first contacting portion essentially in a coplanar manner;
a second contact pin being movable relative to the first contact pin in a vertical direction and having a second contacting portion, said second contact pin intermixing said first contact pin except said first contacting portion and said second contacting portion; and
a coil spring surrounding the intermixed first contact pin and second contact pin except said first contacting portion and second contacting portion; wherein said first contact pin defines a first guiding slot running through the guiding portion and a second guiding slot intimately located beside the first guiding slot while not running through the guiding portion in a thickness direction so as to form a stopping portion at a distal end of the first guiding slot, said second contact pin defines a protrusion and a main body side by side unitarily formed with each other in the thickness direction perpendicular to said vertical direction under condition that the protrusion slides within and along the first guiding slot and stopped by the stopping portion in the vertical direction, and the main body slides within and along the second guiding slot.

8. The electrical contact as claimed in claim 7, wherein the main body is longer than the protrusion along an up-and-down direction.

9. The electrical contact as claimed in claim 7, wherein said first guiding slot and said second guiding slot are formed by a pair of leading arms.

10. An electrical contact comprising:
a first contact pin defining a first contacting portion;
a second contact pin being movable relative to the first contact pin in a vertical direction and having a second contacting portion, said second contact pin intermixing said first contact pin except said first contacting portion and said second contacting portion; and
a coil spring surrounding the intermixed first contact pin and second contact pin except said first contacting portion and second contacting portion; wherein said first contact pin defines a pair of opposite leading arms joined with each other at distal ends thereof, which are closer to the second contacting portion of the second contact pin than any other portions of said first contact pin, so as to form at least one guiding slot between said pair of leading arms, and the second contact pin forms either a body or a protrusion receptively moving along said guiding slot, wherein
the whole first contact pin essentially extends in a vertical plane and correspondingly defines thereof a thickness direction perpendicular to said vertical plane and said vertical direction, and said guiding slot extends through the first contact pin in said thickness direction.

11. The electrical contact as described in claim 10, wherein said pair of leading arms protectively cooperatively sandwich the body in a transverse direction perpendicular to both said thickness direction and said vertical direction.

12. The electrical contact as described in claim 10, wherein the whole second contact pin essentially extends in another vertical plane parallel to said vertical plane, and correspondingly defines thereof another thickness direction perpendicular to said another vertical plane and parallel to said thickness direction.

13. The electrical contact as described in claim 10, wherein said pair of leading arms extend in a coplanar manner with the first contacting portion.

14. The electrical contact as described in claim 7, wherein the main body is protectively hidden behind the guiding portion in a transverse direction perpendicular to both said vertical direction and thickness direction.

* * * * *